(12) United States Patent
Zhou et al.

(10) Patent No.: US 10,685,866 B2
(45) Date of Patent: Jun. 16, 2020

(54) FIN ISOLATION TO MITIGATE LOCAL LAYOUT EFFECTS

(71) Applicant: INTERNATIONAL BUSINESS MACHINES CORPORATION, Armonk, NY (US)

(72) Inventors: Huimei Zhou, Albany, NY (US); Gen Tsutsui, Glenmont, NY (US); Andrew M. Greene, Albany, NY (US); Dechao Guo, Niskayuna, NY (US); Huiming Bu, Glenmont, NY (US); Robert Robison, Colchester, VT (US); Veeraraghavan S. Basker, Schenectady, NY (US); Reinaldo Vega, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/126,521

(22) Filed: Sep. 10, 2018

(65) Prior Publication Data

US 2020/0083088 A1    Mar. 12, 2020

(51) Int. Cl.
| | |
|---|---|
| *H01L 27/088* | (2006.01) |
| *H01L 21/762* | (2006.01) |
| *H01L 29/66* | (2006.01) |
| *H01L 21/32* | (2006.01) |
| *H01L 29/78* | (2006.01) |

(52) U.S. Cl.
CPC ........ *H01L 21/76202* (2013.01); *H01L 21/32* (2013.01); *H01L 29/66545* (2013.01); *H01L 29/66795* (2013.01); *H01L 29/785* (2013.01); *H01L 29/7849* (2013.01)

(58) Field of Classification Search
CPC ........ H01L 21/76202; H01L 29/66545; H01L 29/66705; H01L 29/7849; H01L 29/785
See application file for complete search history.

(56) References Cited

U.S. PATENT DOCUMENTS

| | | | |
|---|---|---|---|
| 4,333,774 A | * | 6/1982 | Kamioka ............ H01L 21/033 257/591 |
| 5,851,901 A | | 12/1998 | Gardner et al. |
| 6,429,456 B1 | | 8/2002 | Takechi et al. |
| 8,021,989 B2 | | 9/2011 | Verhaegen et al. |
| 8,513,073 B1 | | 8/2013 | Basker et al. |
| 8,987,823 B2 | | 3/2015 | Cheng et al. |
| 9,130,040 B2 | | 9/2015 | Park et al. |
| 9,178,068 B1 | | 11/2015 | Cheng et al. |

(Continued)

FOREIGN PATENT DOCUMENTS

CN    104051248    9/2014

OTHER PUBLICATIONS

List of IBM Patents or Patent Applications Treated as Related dated Sep. 13, 2018, 2 pages.

(Continued)

*Primary Examiner* — Phuc T Dang
(74) *Attorney, Agent, or Firm* — Tutunjian & Bitetto, P.C.; Vazken Alexanian

(57) ABSTRACT

Integrated chips and methods of forming the same include oxidizing a portion of a semiconductor fin to electrically isolate active regions of the semiconductor fin. A semiconductor device is formed on each of the active regions.

13 Claims, 6 Drawing Sheets

(56) References Cited

U.S. PATENT DOCUMENTS

| | | |
|---|---|---|
| 9,704,883 B2 | 6/2017 | Wang et al. |
| 9,773,305 B2 | 9/2017 | Ching et al. |
| 9,773,786 B2 | 9/2017 | Ching et al. |
| 9,818,649 B2 | 11/2017 | Chang et al. |
| 9,929,270 B2 | 3/2018 | Balakrishnan et al. |
| 9,953,874 B2 | 4/2018 | Chang et al. |
| 2016/0027775 A1 | 1/2016 | Akarvardar et al. |
| 2016/0086796 A1* | 3/2016 | Chan ............... H01L 29/785 257/347 |
| 2016/0111448 A1* | 4/2016 | Hsu ............... H01L 27/1211 257/506 |
| 2019/0157410 A1* | 5/2019 | Yim ............ H01L 29/42376 |

OTHER PUBLICATIONS

Ex Parte Quayle Action for U.S. Appl. No. 16/126,621 dated Oct. 8, 2019 (12 pages).

\* cited by examiner

FIN ISOLATION TO MITIGATE LOCAL LAYOUT EFFECTS

BACKGROUND

Technical Field

The present invention generally relates to transistor fabrication and, more particularly, to the fabrication of fin field effect transistors without using fin cut processes.

Description of the Related Art

Fin field effect transistors (FinFETs) provide a flexible platform for scaling device sizes. Some existing processes fabricate multiple FinFETs at once by creating a long fin and then cutting that fin into multiple sections with an etch. However, local layout effects arise as a result of such fin cuts, causing a lack of uniformity between devices.

SUMMARY

A method of forming an integrated chip includes oxidizing a portion of a semiconductor fin to electrically isolate active regions of the semiconductor fin. A semiconductor device is formed on each of the active regions.

A method of forming an integrated chip includes forming protective sidewalls on a silicon germanium fin that is formed on a silicon fin. A portion of the silicon germanium fin is oxidized after forming the protective sidewalls to electrically isolate active regions of the semiconductor fin without releasing stress in the silicon germanium fin, completely penetrating the portion of the semiconductor fin, such that the portion of the semiconductor fin is converted to a dielectric material without any conductive path between the active regions. A semiconductor device is formed on each of the active regions.

An integrated chip includes a semiconductor fin having a first active region and a second active region that are electrically separated by an oxide region. A first semiconductor device is formed on the first active region. A second semiconductor device is formed on the second active region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention avoid local layout effects by oxidizing sections of the fin, creating electrically isolated regions without creating local layout effects. In particular, the present embodiments make it possible to form fin field effect transistor (FinFET) devices that have uniform electronic properties.

One property in particular that is addressed by the present embodiments is the stress within the channel material of a FinFET. In silicon germanium devices in particular, being formed on a silicon base creates a stress within the channel layer that affects the threshold voltage of the device. This stress, and hence also the threshold voltage, can be tuned according to design parameters. However, etching such a channel layer to perform a fin cut releases part of the stress in the material, causing unpredictable deviations from the designed device characteristics.

The present embodiments therefore create electrical isolation between adjacent FinFETs by selectively oxidizing regions of the fin. This oxidation converts the exposed regions to dielectric materials without releasing the stress in the neighboring semiconductors. The present embodiments show four distinct phases of the fabrication process in which the oxidation may be performed, all following the same principles.

Figure 1:
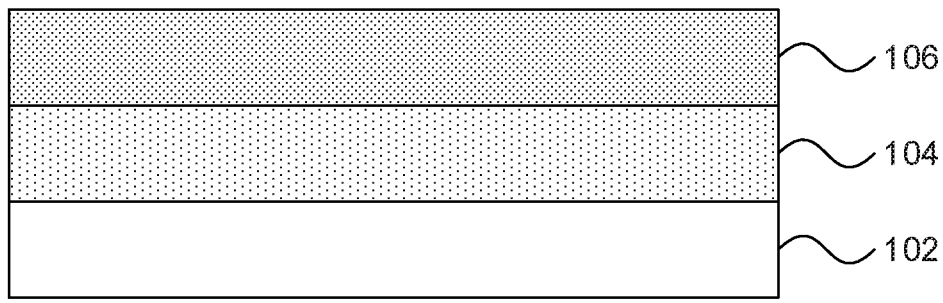
FIG. 1 is a cross-sectional diagram of a step in the fabrication of an integrated chip that shows the formation of a semiconductor fin in accordance with an embodiment of the present invention.

Referring now to FIG. 1, a step in a first embodiment of the electrical isolation of regions of a fin, without a fin cut, by oxidizing a portion of the fin is shown. A channel fin 106 is formed on an intermediate layer 104, which in turn is formed on a substrate 102. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the substrate 102 may also be a semiconductor on insulator (SOI) substrate.

Although it is specifically contemplated that the substrate 102 may be a semiconductor substrate, for compatibility with existing processes, it should be understood that nothing in the present embodiments relies on semiconducting properties in the substrate 102. As a result, the substrate 102 may be formed from dielectric materials instead of semiconductor materials.

The intermediate layer 104 is specifically contemplated as being, for example, a silicon layer, but it should be understood that any appropriate semiconductor material may be used instead. In some embodiments the intermediate layer 104 may be omitted entirely, while in still other embodiments the intermediate layer 104 may be replaced with a silicon dioxide layer.

The channel fin 106 is formed from any appropriate semiconductor material. It is specifically contemplated that silicon germanium may be used, but it should be understood that other compatible semiconductor materials, such as silicon or germanium, may be used instead. A layer of channel material is patterned and etched to form channel fin 106. The cross-section of FIG. 1 shows a section of the structure taken parallel to the channel fin 106. It should be understood that a silicon germanium channel fin 106 formed on a silicon intermediate layer 104 will produce stress within the silicon germanium channel fin 106 that can be selected to tune device properties such as, e.g., threshold voltage. Other embodiments may use, for example, a silicon channel layer 106 formed on a silicon dioxide intermediate layer 104. Although such embodiments do not exhibit significant stress effects, application of the present principles nonetheless provides superior process uniformity.

It is specifically contemplated that the channel fin 106 may be formed by an appropriate anisotropic etch, such as reactive ion etching (RIE). RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the channel fin 106 can be formed by a spacer imaging transfer process.

The particular materials described above are selected because of the compatibility of their respective crystalline structures. Specifically, silicon, germanium, and silicon germanium with varying germanium concentrations have similar crystalline structures with slightly different spacing between the component atoms. This relationship between the materials makes it possible to epitaxially grow a layer of one material directly on a surface of another material, providing a single crystal with multiple layers.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Crystalline orientation refers to the ordered arrangement atoms in a particular crystal structure along a given surface. In one example, silicon forms a "face-centered diamond-cubic" crystal structure, and cutting a silicon crystal along different planes will result in differing patterns of atoms being presented along the surface that is produced. These patterns are identified with Miller indices (e.g., <100>, <111>, etc), with different Miller indices corresponding to different crystalline orientations. Different crystalline orientations will have different properties during certain processes, such as etches and epitaxial growth.

A result of the different spacing between the atoms of different materials in such a crystal is that the materials will experience stress at their interfaces. In particular, a thick layer of silicon will cause a relatively thin layer of silicon germanium to be under stress as the atoms of the silicon germanium layer conform to the crystalline structure of the thick silicon layer. Conversely, a thick layer of silicon germanium will experience relatively little stress at an interface with a relatively thin layer of silicon, as its internal structure will be closer to its natural state. Different levels of strain in a silicon germanium layer will produce different electronic properties in a transistor device by, for example, changing the threshold voltage of the transistor.

In view of the above, it should be understood that other materials may be used instead of the recited silicon and silicon germanium. It is specifically contemplated that, for example, germanium may be substituted for one or more of the layers in question. It should also be understood that any other set of materials may be used instead if they have compatible crystalline structures.

Although not shown in the figures, a layer of dielectric material may be conformally deposited and subsequently anisotropically etched to form fin sidewalls that leave the top surface of the channel fin 106 exposed. The sidewalls may be formed from, e.g., silicon nitride or any other appropriate dielectric material and protect the channel fin 106 from horizontal oxidation during subsequent oxidation processes. The deposition of such sidewalls may be performed at any point in the process before the relevant oxidation.

Figure 2:
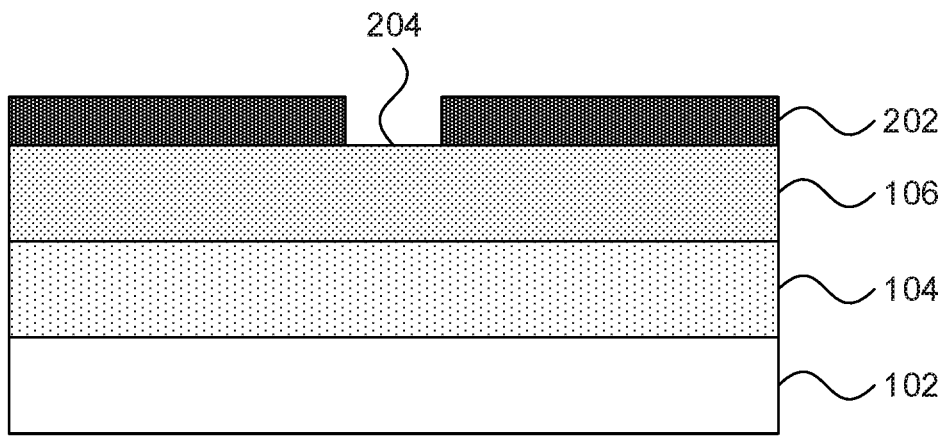
FIG. 2 is a cross-sectional diagram of a step in the fabrication of an integrated chip that shows the formation of a mask on the semiconductor fin that exposes a region of the semiconductor fin in accordance with an embodiment of the present invention.

Referring now to FIG. 2, a step in a first embodiment of the electrical isolation of regions of a fin, without a fin cut, by oxidizing a portion of the fin is shown. A mask 202 is formed over the channel fin 106. The mask may be formed photolithographically, leaving exposed a portion 204 of channel fin 106 that is to be oxidized. The portion 204 is thus positioned between active device regions of the channel fin 106. It is specifically contemplated that a hardmask material, such as silicon nitride, may be used to form the mask 202, but it should be understood that any appropriate material that will not be damaged by the subsequent oxidation process may be used instead.

Figure 3:
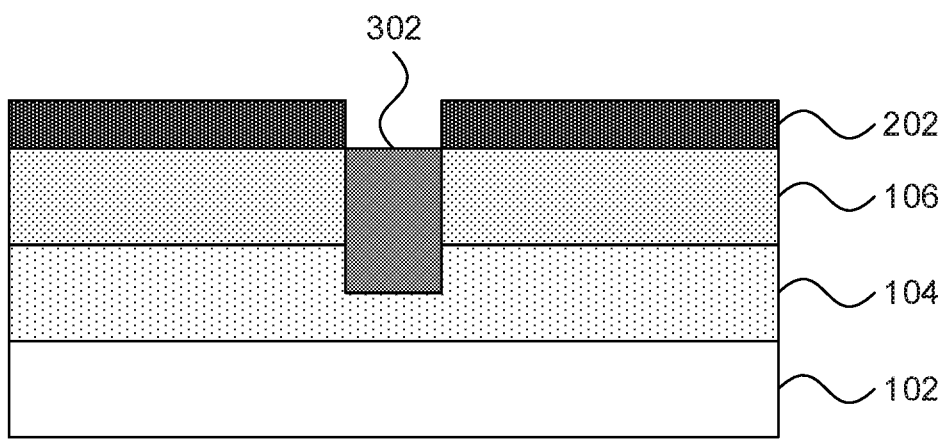
FIG. 3 is a cross-sectional diagram of a step in the fabrication of an integrated chip that shows the oxidation of a region of the semiconductor fin in accordance with an embodiment of the present invention.

Referring now to FIG. 3, a step in a first embodiment of the electrical isolation of regions of a fin, without a fin cut, by oxidizing a portion of the fin is shown. An oxidation process is performed that creates an oxidized region 302 that fully penetrated exposed portion 204 of channel fin 106. The oxidation process may also oxidize a portion of the underlying intermediate layer 104. This oxidized region 302 provides electrical isolation between the unexposed portions of the channel fin 106. Any appropriate oxidation process may be used including, e.g., dry oxidation, wet oxidation, or any thermal oxidation process.

In the specific embodiment where silicon germanium is used for the channel layer 106, the oxidation process causes a reaction between oxygen and the silicon in the silicon germanium channel material, forcing the germanium of the silicon germanium channel material to move out and does not substantially alter the stress in the channel fin 106.

After the formation of the oxidized region 302, the mask 204 can be removed by any appropriate selective etch process. As used herein, the term "selective" in reference to a material removal process denotes that the rate of material removal for a first material is greater than the rate of removal for at least another material of the structure to which the material removal process is being applied. Thus, individual layers can be selectively removed without substantially damaging the other layers.

At this point, subsequent processing steps may be performed to finish a set of FinFET devices. In particular, it is contemplated that source/drain regions may be formed on the channel fin 106 by any appropriate process such as, e.g., dopant implantation. A gate stack may be formed over the fin, including a gate dielectric and a gate conductor. Electrical contacts to the source/drain region and to the gate conductor may be formed by any appropriate process.

Figure 4:
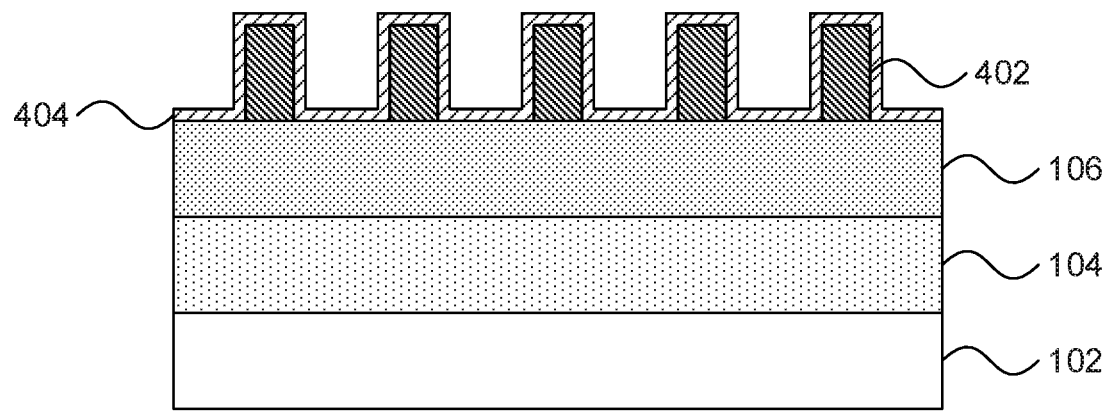
FIG. 4 is a cross-sectional diagram of a step in the fabrication of an integrated chip that shows the formation of dummy gate structures on the semiconductor fin in accordance with an embodiment of the present invention.

Referring now to FIG. 4, a step in a second embodiment of the electrical isolation of regions of a fin, without a fin cut, by oxidizing a portion of the fin is shown. In this embodiment, oxidation of the fin is performed after formation of dummy gate structures 402. The dummy gate structures 402 may be formed by any appropriate process, such as an anisotropic etch or sidewall image transfer. The dummy gate structures 402 may include, for example, a dummy gate dielectric formed from, e.g., silicon dioxide, and a dummy gate formed from, e.g., polysilicon. Spacers 404 are formed from any appropriate hardmask material such as, e.g., silicon nitride, using any appropriate conformal process such as, e.g., CVD or ALD. The dummy gate structures 402 may furthermore include other structures such as, e.g., masks remaining from a photolithography process and any other incidental layers or materials that may result from the fabrication of the dummy gate structures 402.

Figure 5:
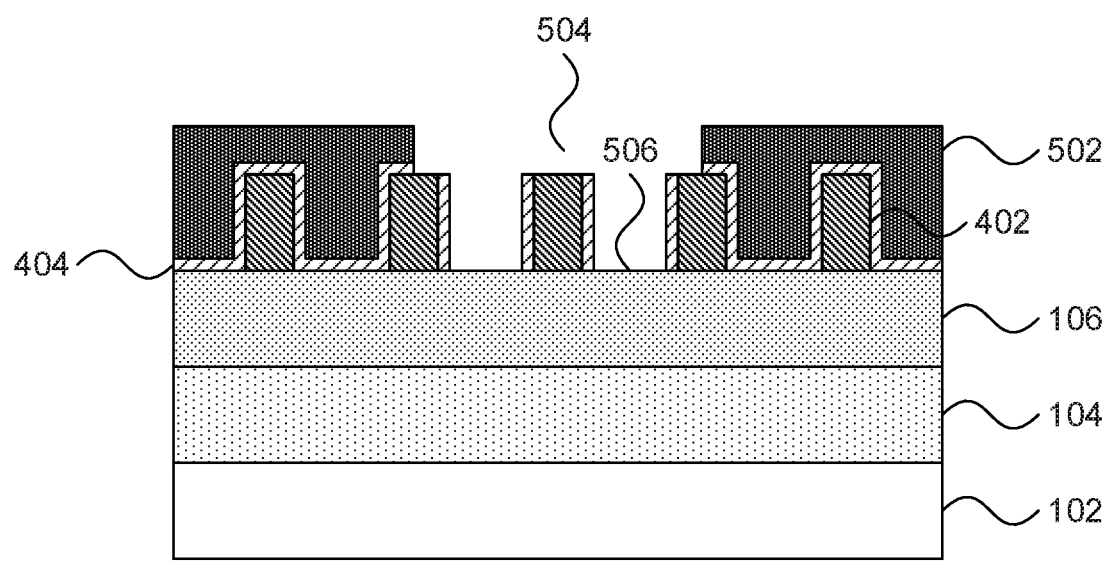
FIG. 5 is a cross-sectional diagram of a step in the fabrication of an integrated chip that shows the formation of a mask on the semiconductor fin and dummy gate structures that exposes a region of the semiconductor fin in accordance with an embodiment of the present invention.

Referring now to FIG. 5, a step in a second embodiment of the electrical isolation of regions of a fin, without a fin cut, by oxidizing a portion of the fin is shown. A mask 502 is formed over the dummy gate structures 402 and spacers 404 with a gap 504 that exposes at least one portion 506 of the channel fin 106 that is to be oxidized. The spacers 404 are etched away from horizontal surfaces using an appropriate anisotropic etch. As above, the mask 502 may be formed photolithographically. The portion 506 is thus positioned between active device regions of the channel fin 106. It is specifically contemplated that a hardmask material, such as silicon nitride, may be used to form the mask 502, but it should be understood that any appropriate material that will not be damaged by the subsequent oxidation process may be used instead.

Figure 6:
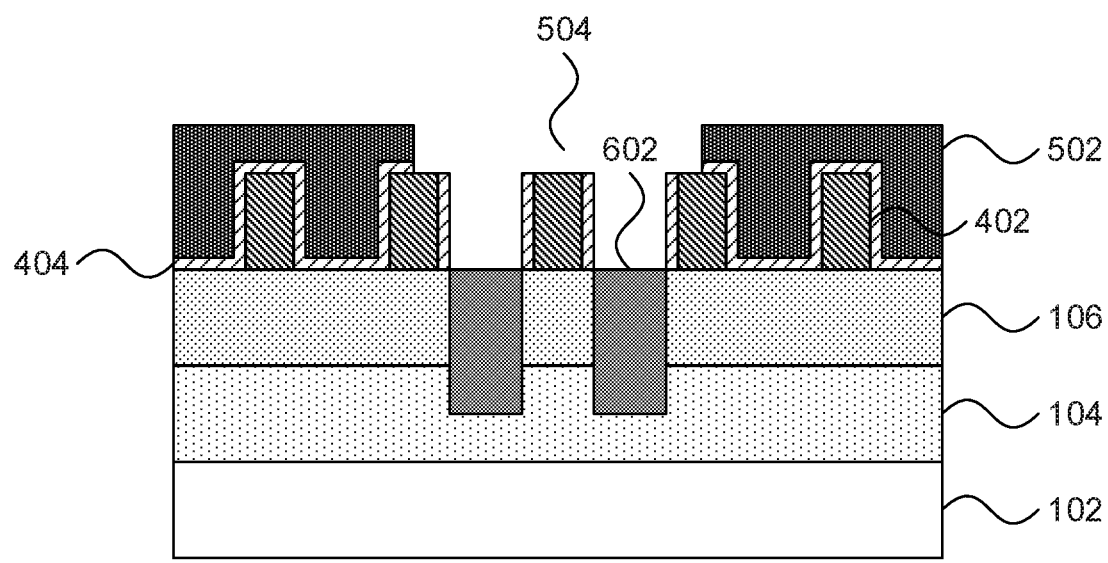
FIG. 6 is a cross-sectional diagram of a step in the fabrication of an integrated chip that shows the oxidation of a region of the semiconductor fin in accordance with an embodiment of the present invention.

Referring now to FIG. 6, a step in a second embodiment of the electrical isolation of regions of a fin, without a fin cut, by oxidizing a portion of the fin is shown. An oxidation process is performed that creates an oxidized region 602 that fully penetrated exposed portion 506 of channel fin 106. The oxidation process may also oxidize a portion of the underlying intermediate layer 104. This oxidized region 602 provides electrical isolation between the unexposed portions of the channel fin 106.

After the formation of the oxidized region 602, the mask 502 can be removed by any appropriate selective etch process. At this point, subsequent processing steps may be performed to finish a set of FinFET devices. In particular, it is contemplated that source/drain regions may be formed on the channel fin 106 by any appropriate process such as, e.g., dopant implantation. The dummy gate structure 402 may be replaced by a final gate structure in, e.g., a replacement metal gate process. A gate stack may thereby be formed over the fin, including a gate dielectric and a gate conductor. Electrical contacts to the source/drain region and to the gate conductor may be formed by any appropriate process.

Figure 7:
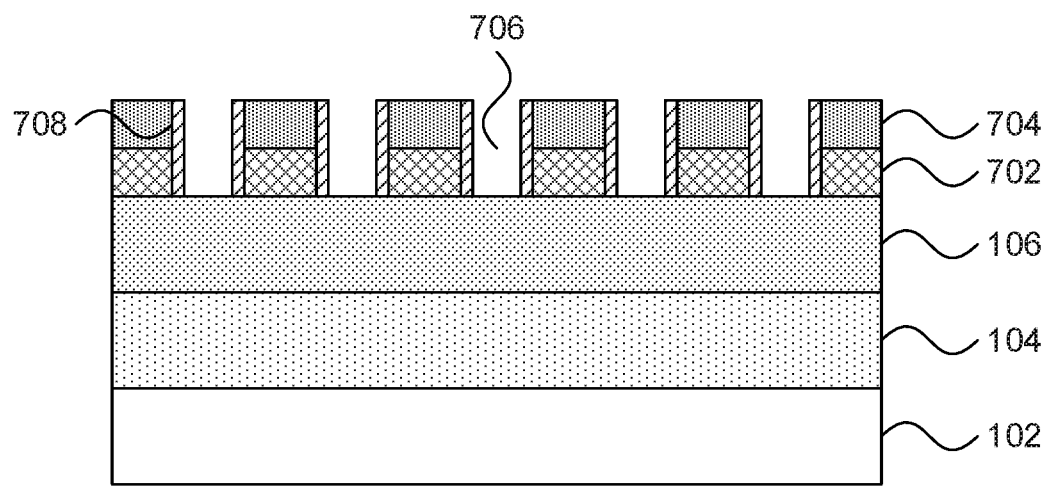
FIG. 7 is a cross-sectional diagram of a step in the fabrication of an integrated chip that shows the formation of source/drain regions on a semiconductor fin in accordance with an embodiment of the present invention.

Referring now to FIG. 7, a step in a third embodiment of the electrical isolation of regions of a fin, without a fin cut, by oxidizing a portion of the fin is shown. In this embodiment, the oxidation is performed after the formation of source/drain regions 702 and the removal of dummy gate structures. The source/drain regions 702 have been formed on the channel fin 106 by, for example, epitaxial growth and are doped in situ or through implantation. A passivating layer 704 of, e.g., silicon dioxide or any other appropriate dielectric material is formed over the source/drain regions 702. A set of gate sidewalls 708 remain after removal of the dummy gate structures, leaving open gaps 706 that expose channel regions of the channel fin 106.

Figure 8:
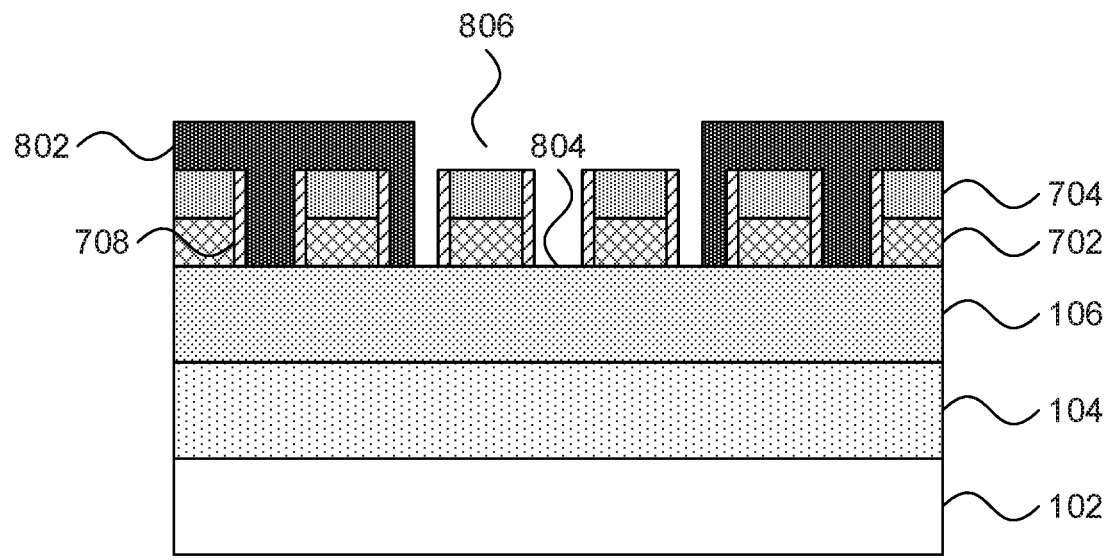
FIG. 8 is a cross-sectional diagram of a step in the fabrication of an integrated chip that shows the formation of a mask on the semiconductor fin that exposes a region of the semiconductor fin in accordance with an embodiment of the present invention.

Referring now to FIG. 8, a step in a third embodiment of the electrical isolation of regions of a fin, without a fin cut, by oxidizing a portion of the fin is shown. A mask 802 is formed over the source/drain regions 702 and sidewalls 708, with a gap 806 that exposes at least one portion 804 of the channel fin 106 that is to be oxidized. As above, the mask 802 may be formed photolithographically or by any other appropriate process. The portion 804 is thus positioned between active device regions of the channel fin 106. Although the mask 802 is shown as being formed to leave open space to the sides of the source/drain regions 702, it should be understood that the mask 802 may alternatively be formed with edges that land on top of respective source/drain regions 702, such that any exposed portions 804 are shown as being defined by the separation between adjacent source/drain regions 702.

It is specifically contemplated that a hardmask material, such as silicon nitride, may be used to form the mask 802, but it should be understood that any appropriate material that will not be damaged by the subsequent oxidation process may be used instead and that the material for the mask 802 should have etch selectivity with the sidewalls 708.

Figure 9:
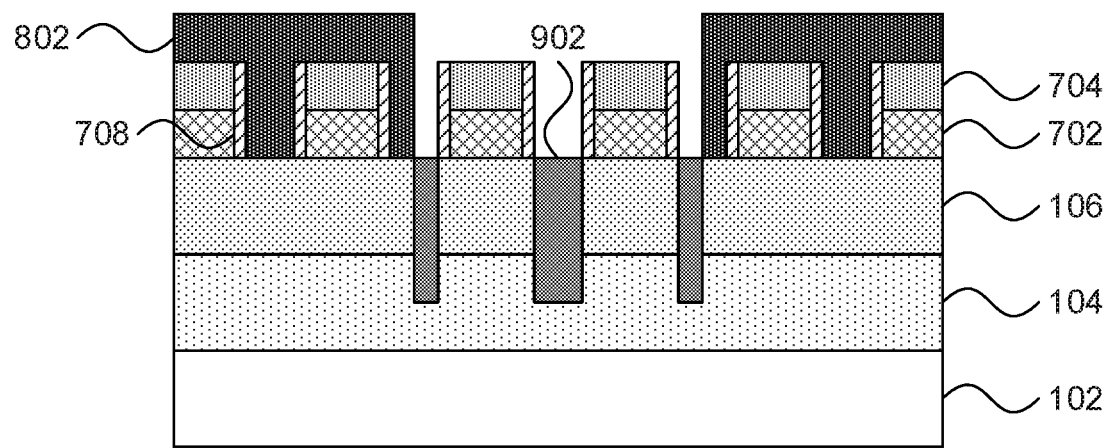
FIG. 9 is a cross-sectional diagram of a step in the fabrication of an integrated chip that shows the oxidation of a region of the semiconductor fin in accordance with an embodiment of the present invention.

Referring now to FIG. 9, a step in a third embodiment of the electrical isolation of regions of a fin, without a fin cut, by oxidizing a portion of the fin is shown. An oxidation process is performed that creates an oxidized region 902 that fully penetrated exposed portion 804 of channel fin 106. The oxidation process may also oxidize a portion of the underlying intermediate layer 104. This oxidized region 902 provides electrical isolation between the unexposed portions of the channel fin 106.

After formation of the oxidized region 902, the mask 802 can be removed by any appropriate selective etch process. At this point, subsequent processing steps may be performed to finish a set of FinFET devices. In particular, it is contemplated that the gaps between sidewalls 708 may be filled with a final gate structure in, e.g., a replacement metal gate process. A gate stack may thereby be formed over the fin 106, including a gate dielectric and a gate conductor. Electrical contacts to the source/drain region and to the gate conductor may be formed by any appropriate process.

Figure 11:
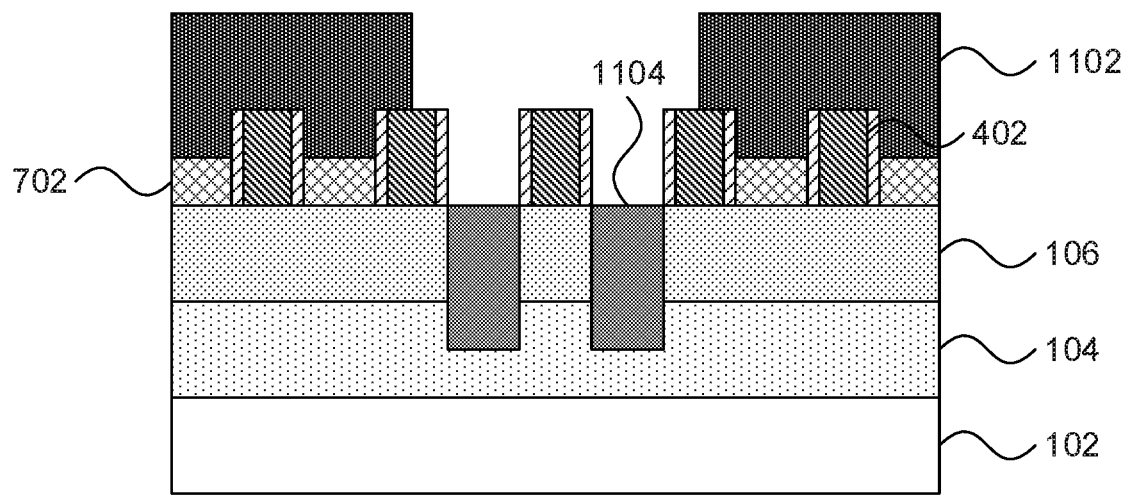
FIG. 11 is a cross-sectional diagram of a step in the fabrication of an integrated chip that shows the oxidation of a region of the semiconductor fin after formation of source/drain regions and before removal of the dummy gate structures in accordance with an embodiment of the present invention.

Referring now to FIG. 11, a step in a fourth embodiment of the electrical isolation of regions of a fin, without a fin cut, by oxidizing a portion of the fin is shown. In this embodiment, the oxidation is performed after formation of source/drain regions 702, but before removal of the dummy gate structures 402. The source/drain regions 702 may be inhibited from growing in certain regions of the channel fin 106 by masking those regions, thereby leaving the channel fin 106 exposed. A mask 1102 can then be formed over the source/drain regions 702 to leave exposed portions of the channel fin 106 for oxidation, forming oxidized regions 1104.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
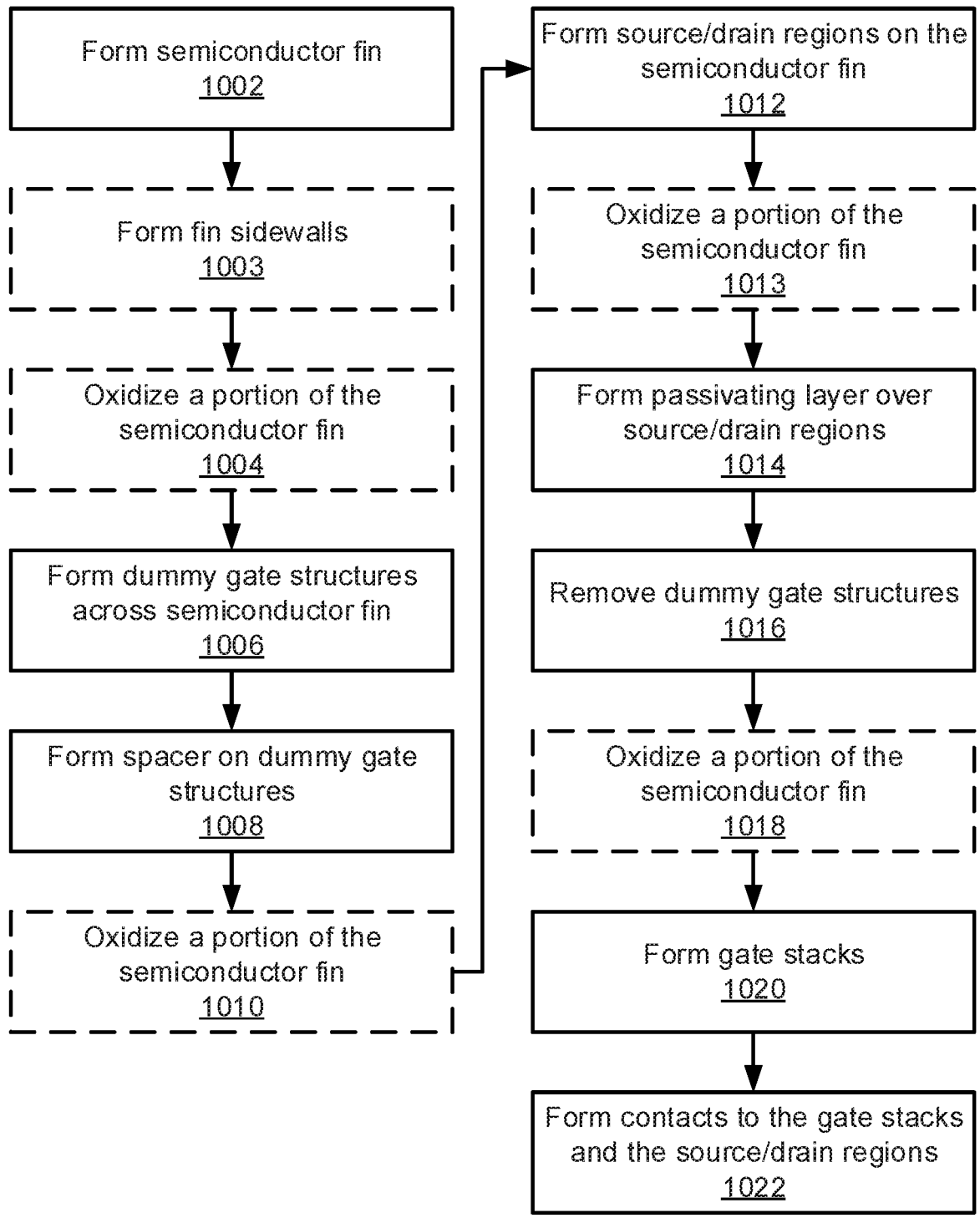
FIG. 10 is a block/flow diagram of a method of forming an integrated chip with improved process uniformity in accordance with an embodiment of the present invention.

Referring now to FIG. 10, a method of forming a FinFET is shown. The method that is shown includes a step of oxidizing a portion of a semiconductor fin, illustrated with a dashed line, that can be performed at different points in the process. Although it is specifically contemplated that the oxidization step will be performed only once, it should be understood that multiple oxidation steps may be performed at different points in the fabrication process.

Block 1002 forms semiconductor fin 106. As noted above, the semiconductor fin 106 may be formed on an intermediate layer 104 over a substrate 102 by any appropriate mechanism including, e.g., photolithographic masking and an anisotropic etch or sidewall image transfer. Block 1003 optionally deposits protective fin sidewalls to protect the fin from horizontal oxidation. This step is shown as being performed before the oxidation of block 1004 but may, alternatively, be performed at any point in the process before an oxidation step. Block 1004 may, at this stage, oxidize a portion 302 of the channel fin 106 by masking the fin 106 and performing a directional oxidation process that penetrates the channel fin 106, electrically isolating active regions of the channel fin 106. The mask 202 can then be removed.

Block 1006 then forms one or more dummy gate structures 402 across the channel fin 106 and block 1008 forms spacer 404 on the dummy gate structures 402. The dummy gate structures 402 may include a dummy gate dielectric layer and a dummy gate and may be formed by any appropriate process, such as photolithographic masking with an anisotropic etch or a sidewall image transfer process. The spacer 404 can be formed from any appropriate hardmask material and may be formed by a conformal deposition process such as, e.g., CVD or ALD. In some embodiments, the spacer 404 may be removed from horizontal surfaces after deposition by a timed anisotropic etch that leaves the bulk of the material on horizontal surfaces remaining.

After formation of the dummy gate structures, block 1010 may optionally oxidize a portion 506 of the channel fin 106 by applying a mask 502 over the fin 106. If multiple dummy gate structures 402 are formed, the mask 502 may leave multiple such portions 506 exposed, separated by one or more dummy gate structures 402. The mask 502 may thus cover one or more dummy gate structures 402, may cover all dummy gate structures 402, or may leave all dummy gate structures 402 exposed. Block 1010 then optionally applies an oxidation process to change the material of the channel fin 106 into oxide 602, said oxide 602 fully penetrating the channel fin 106 to separate the channel fin 106 into multiple, electrically isolated active regions. The mask 502 can then be removed.

Block 1012 forms source/drain regions 702 on the channel fin 106. This may be accomplished by, e.g., epitaxially growing source/drain extensions on the channel fin 106 with in situ doping. In other embodiments, the source/drain regions may be formed by implanting dopants directly into regions of the channel fin 106. At this stage, block 1013 may optionally apply an oxidation process to change material of the channel fin 106 into oxide 1104, with the oxide fully penetrating the channel fin 106 to separate the channel fin 106 into multiple, electrically isolated active regions. If the optional oxidation of block 1013 is to be performed, then block 1012 will include a masking step to cover a portion of the channel fin 106 where the oxide will be formed, preventing the growth of source/drain structures 702 on the channel fin 106 in the masked area. This preserves the channel fin surfaces for subsequent oxidation.

Block 1014 then forms a passivating layer 704 over the source/drain regions 702 by depositing a durable, insulating material. The insulating material may include silicon dioxide that is deposited by a flowable CVD process, but it should be understood that other materials and deposition processes may be used instead. The insulating material may be deposited to a height that exceeds a height of the spacers 708 and may then be polished down using, e.g., a chemical mechanical planarization process that stops on the dummy gate structures 402. Block 1016 then removes the dummy gate structures 402, exposing areas of the channel fin 106.

Block 1018 may optionally oxidize regions of the channel fin 106 at this stage. A mask 802 is formed over the channel fin 106, leaving portions 804 exposed. The mask 802 may cover one or more source/drain regions 702, may cover all source/drain regions 702, or may leave all source/drain regions 702 exposed. Block 1018 then applies an oxidation process to change the material of the channel fin 106 into oxide 902, said oxide 902 fully penetrating the channel fin 106 to separate the channel fin 106 into multiple, electrically isolated active regions. The mask 802 can then be removed.

Block 1020 then forms gate stacks between source/drain regions 702. The gate stacks include, e.g., a gate dielectric and a gate conductor, but may also include a work function metal and other structures. The gate stacks may be formed by any appropriate processes, including sequential deposition steps by appropriate conformal or directional deposition processes. Block 1022 then forms conductive contacts to the gate stacks and to the source/drain regions 702. Block 1022 may therefore etch a via through the passivating layer 704 to reach the source/drain regions 702 before depositing conductive material in the via.

Having described preferred embodiments of fin isolation to mitigate local layout effects (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an integrated chip, comprising:
   oxidizing a portion of a semiconductor fin to electrically isolate active regions of the semiconductor fin; and
   forming a semiconductor device on each of the active regions.

2. The method of claim 1, wherein oxidizing the portion of the semiconductor fin completely penetrates the portion of the semiconductor fin, such that the portion of the semiconductor fin is converted to a dielectric material without any conductive path between the active regions.

3. The method of claim 1, wherein forming the semiconductor device on each of the active regions comprises forming a dummy gate structure on the semiconductor fin.

4. The method of claim 3, wherein oxidizing the portion of the semiconductor fin is performed after forming the dummy gate structure.

5. The method of claim 3, wherein forming the semiconductor device on each of the active regions further comprises forming source and drain regions adjacent to the dummy gate structure.

6. The method of claim 5, wherein oxidizing the portion of the semiconductor fin is performed after forming the dummy gate structure and before forming the source and drain regions.

7. The method of claim 5, wherein forming the semiconductor device on each of the active regions comprises removing the dummy gate structure and forming a gate stack after forming the source and drain regions.

8. The method of claim 7, wherein oxidizing the portion of the semiconductor fin is performed after removing the dummy gate structure and before forming the gate stack.

9. The method of claim 1, further comprising forming protective sidewalls on the semiconductor fin before oxidizing the portion of the semiconductor fin.

10. A method of forming an integrated chip, comprising:
forming protective sidewalls on a silicon germanium fin that is formed on a silicon fin;
oxidizing a portion of the silicon germanium fin after forming the protective sidewalls to electrically isolate active regions of the semiconductor fin without releasing stress in the silicon germanium fin, completely penetrating the portion of the semiconductor fin, such that the portion of the semiconductor fin is converted to a dielectric material without any conductive path between the active regions; and
forming a semiconductor device on each of the active regions.

11. A method of forming an integrated chip, comprising:
forming a dummy gate on the semiconductor fin;
forming source and drain regions adjacent to the dummy gate;
oxidizing a portion of a semiconductor fin to electrically isolate active regions of the semiconductor fin after forming the source and drain regions; and
removing the dummy gate and forming a gate stack after oxidizing the portion of the semiconductor fin.

12. The method of claim 11, wherein oxidizing the portion of the semiconductor fin completely penetrates the portion of the semiconductor fin, such that the portion of the semiconductor fin is converted to a dielectric material without any conductive path between the active regions.

13. The method of claim 11, further comprising forming protective sidewalls on the semiconductor fin before oxidizing the portion of the semiconductor fin.

* * * * *